United States Patent [19]

Beck

[11] Patent Number: 4,591,392
[45] Date of Patent: May 27, 1986

[54] FORMING AN ORDERED ARRAY FOR VISUAL INSPECTION

[75] Inventor: Patricia A. Beck, Atlantic City, N.J.

[73] Assignee: AT&T Bell Laboratories, Murray Hill, N.J.

[21] Appl. No.: 680,801

[22] Filed: Dec. 13, 1984

[51] Int. Cl.⁴ .............................................. B08B 1/00
[52] U.S. Cl. .................................... 134/25.4; 134/32; 134/34
[58] Field of Search ................... 134/25.1, 25.2, 25.4, 134/33, 34, 39, 40, 32

[56] References Cited

U.S. PATENT DOCUMENTS

Re. 30,977  6/1982  Zecher ............................... 134/25.4
3,997,358  12/1976  Taylor ................................ 134/25.4
4,156,619  5/1979  Griesshammer ...................... 134/2

Primary Examiner—Richard V. Fisher
Assistant Examiner—Sharon T. Cohen
Attorney, Agent, or Firm—Lester H. Birnbaum

[57] ABSTRACT

Disclosed is a method of producing a suitable array of semiconductor chips or other objects for visual inspection. Semiconductor chips on the order of a few hundred microns on each side are placed onto a mesh screen in a container, then submersed in deionized water, so that the chips begin to float and the fluid never covers the upper surfaces of the chips. Gently swirling the fluid causes the chips to orient in the center of the container. Continued swirling aligns the chips into an orderly array of rows and columns.

9 Claims, 12 Drawing Figures

FORMING AN ORDERED ARRAY FOR VISUAL INSPECTION

BACKGROUND OF THE INVENTION

This invention relates to methods of ordering small objects, such as semiconductor chips, in arrays suitable for visual inspection.

Typically, most visual inspection systems, such as those used in robotics, have trouble in distinguishing objects that overlap. Therefore, a method of ordering chips for this specific use without damaging the chips is necessary. In the past, the task of ordering and testing semiconductor chips was done by a human operator, who separated and examined each small chip using a camel hair brush, tweezers, a needle-like vacuum pickup, and a lot of patient effort. If time were not a parameter of concern in the development of products which incorporate these chips, then the human operator would sufficiently provide this service (assuming no significant damage where done by the tweezers and the pickup). However, time is an important factor, and other methods of ordering, such as vibrating the chips on a surface to produce a nonoverlapping pattern, are currently being used and investigated. Vibrating the chips in some cases is harmful because it scratches the chips.

It is therefore an object of this invention to provide a means for producing a suitable array of objects which may be inspected effectively by a visual inspection system.

SUMMARY OF THE INVENTION

This and other objects are achieved in accordance with the present invention which is a method of producing a nonoverlapping ordered array of objects. The method comprises placing the objects onto a mesh within a container and then partially submerging the container into a suitable fluid bath to cause the objects to float. The fluid is swirled to cause the objects to order themselves in the center of the container. When an acceptable amount of ordering is accomplished, the container is removed from the bath.

BRIEF DESCRIPTION OF THE DRAWINGS

The invention will be more readily understood after reading the following detailed description in conjunction with the drawings wherein.

It will be appreciated that, for purposes of illustration, these Figures are not necessarily drawn to scale.

DETAILED DESCRIPTION

Figure 1:
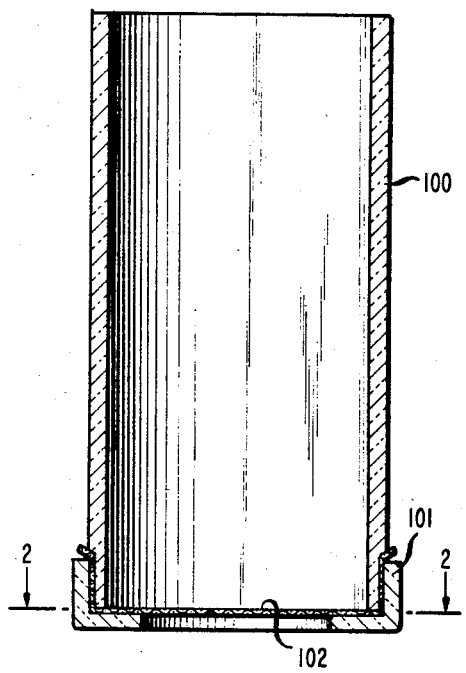
FIG. 1 is a cross-sectional view of a portion of an apparatus useful for practicing the invention in accordance with one embodiment.
Figure 2:
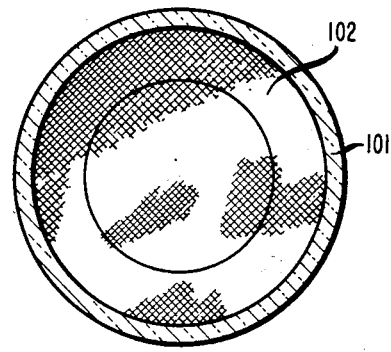
FIG. 2 is a view along 2—2 of FIG. 1.

The method of producing an orderly array of semiconductor chips includes the use of a suitable container and taking advantage of some simple physical properties. As shown in FIG. 1, a container (100) comprising a material such as polystyrene or plastic was open at both ends but had a tightly fitting removable rim (101) at one end. The diameter of the container was typically ½ to 4 inches. A screen of mesh material (102) that is suitable for use with chips of the magnitude 200 to 500 microns on a side was held taut over one end of the container by the rim which was slipped onto the end of the container. A view along 2—2 of FIG. 1 is shown in FIG. 2. In this example, the mesh was nylon, but other types of mesh such as metal screens and porous steel may be used.

In general, a flat mesh material is preferred. If the material is woven, the height of the weave should not cause the sample to tilt, otherwise unwanted reflections may be produced in the inspection system. The mesh should have a large proportion of open area (at least 45%) consisting of a large number of small holes. An even spacing of holes is preferred. The size of the openings will vary depending upon the objects being ordered. Generally, a minimum hole size will be approximately 50 $\mu$m on a side to permit fluid to come through the mesh as described below. Preferably, a maximum hole size would be approximately 50% of the side dimension of the object (¼ of the area) to achieve a non-tilted array of chips.

Figure 3:
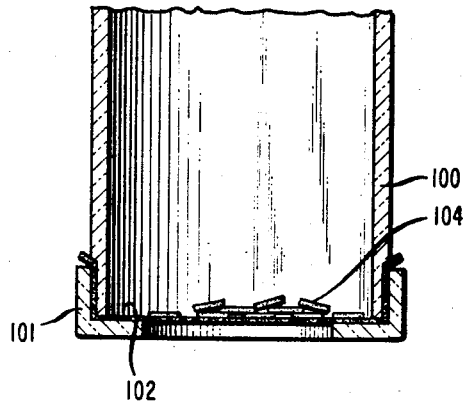
FIGS. 3–7 are cross-sectional schematic illustrations of the apparatus of FIG. 1 during various steps in accordance with one embodiment of the invention.
Figure 4:
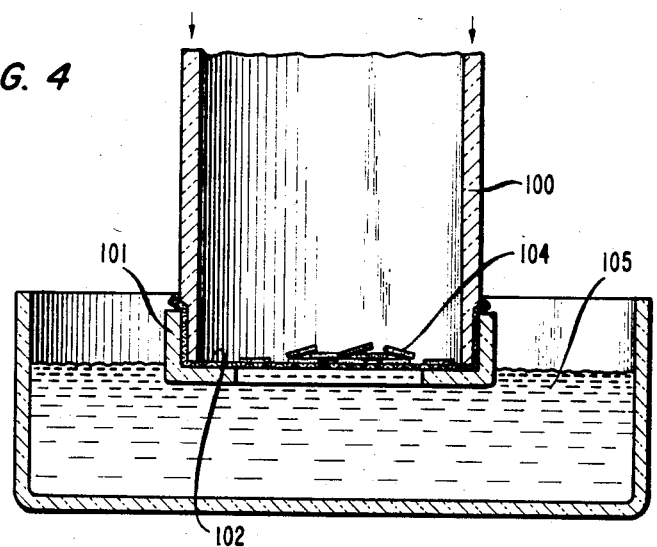

A sequence of steps in accordance with one embodiment of the invention is illustrated in FIGS. 3–7. As shown in FIG. 3, a stack of chips, such as 104, was placed on the mesh screen (102) in an unordered, overlapping pile. These chips measured 250×500 $\mu$m and numbered in the range 100–400 depending on the size of the container. As shown in FIG. 4, the container (100) was partly submerged in a fluid (105) which in this example is deionized water. However, other fluids may be used provided they do not damage the chip structure and the fluid has adequate surface tension to float the chips, as explained below. Other suitable fluids may include ethylene glycol or a mixture of methyl alcohol and water.

Figure 5:
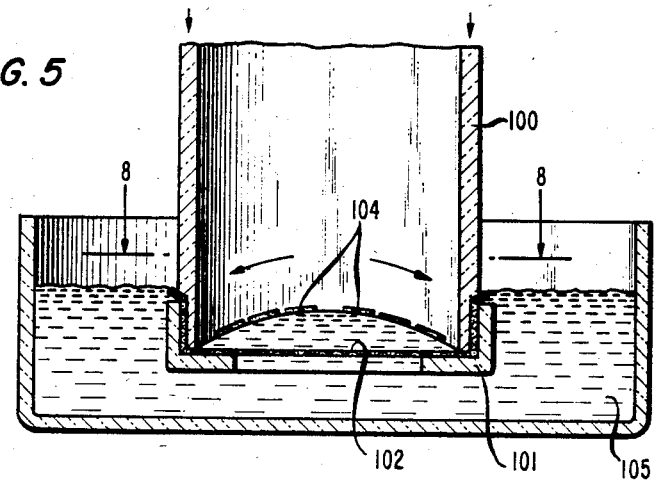
Figure 8:
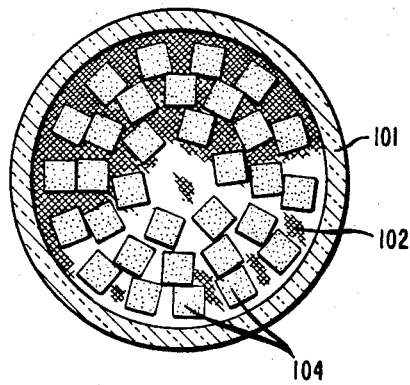
FIGS. 8–9 are views of the apparatus along 8—8 of FIG. 5 and 9—9 of FIG. 6, respectively, during various steps in accordance with the same embodiment.

When the container is lowered into the bath, the surface tension of the fluid and the small mesh size cause a convex surface of fluid to be formed in the container without covering the upper surfaces of the chips as shown in FIG. 5. The chips float on this convex surface, and as the radius of curvature increases, the chips slip to the sides of the container and form a recognizable ring pattern as shown in the view of FIG. 8. The combination of fluid surface tension and mesh size thereby causes the chips to separate into a nonoverlapping array. The surface tension of the fluid in this example was 72.75 dynes/cm and the mesh size was 65 $\mu$m holes and 65 $\mu$m spaces. In general, it is recommended that the surface tension be in the range 50–90 dynes/cm to insure a sufficient convex surface for separating the chips and for supporting the chips without wetting them.

Figure 6:
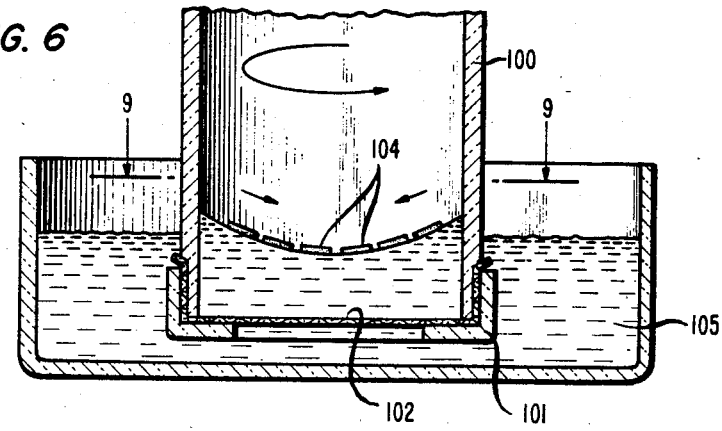
Figure 7:
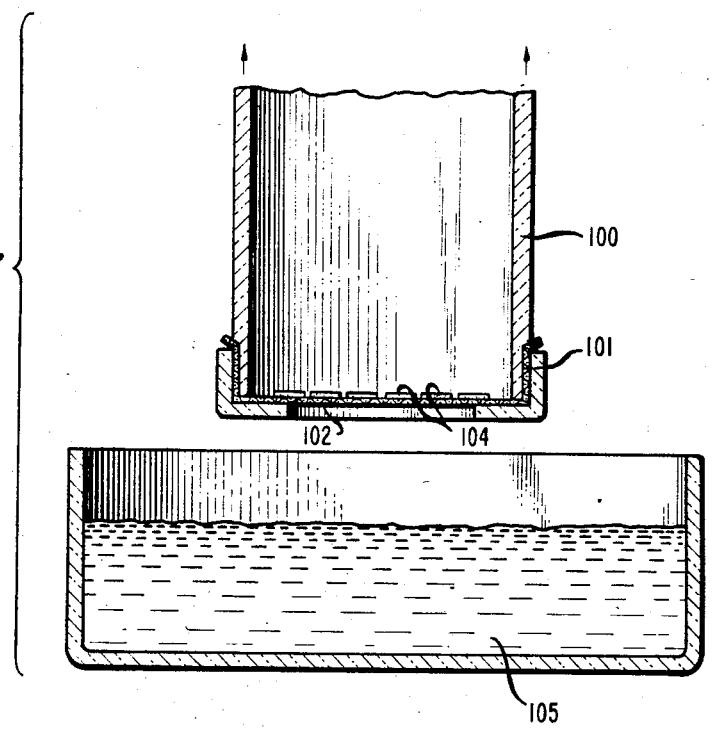
Figure 9:
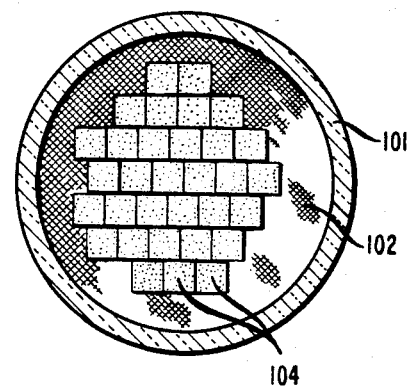

Next, as illustrated in FIG. 6, the fluid was swirled by rotating the container. This causes the chips to move to the center of the container, because the center of the swirling action is the path of least resistance. This property is analogous to a whirlpool wherein the eye or the center of the whirlpool is calm. Continued swirling of the fluid increases the order of the chips. After approximately 3-30 secs, the chips will be ordered in an array of rows and columns as shown in FIG. 9 which is a view along line 9—9 of FIG. 6. Then, as shown in FIG. 7, the container was lifted out of the fluid in a perpendicular direction so that the fluid recedes and deposits the chips on the mesh in the close packed array structure of FIG. 9.

Another important advantage of producing an array in this manner is that one may immediately determine defective or irregular chips by looking at the rows of chips. If an irregular chip is present, a fault is quite notable, since the chips will form an irregular array conforming to the configuration of the defective chip in that area.

Figure 10:
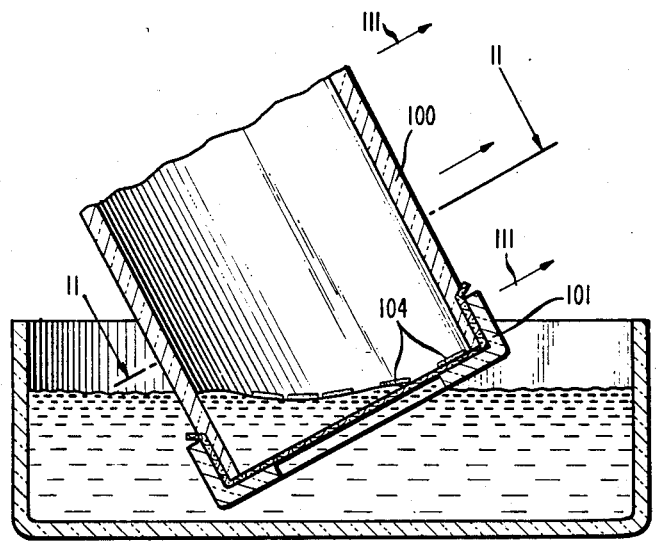
FIG. 10 is a cross-sectional view of a portion of the apparatus of FIG. 1 during one step in accordance with a further embodiment of the invention.
Figure 11:
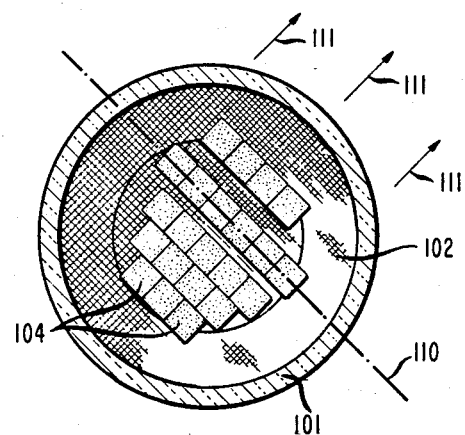
FIG. 11 is another view of the apparatus according to the same embodiment.

If it is desirable to separate the rows of chips, the inventive method can be modified slightly by withdrawing the container at an angle to the fluid other than 90 degrees as shown in FIG. 10. The chips will therefore follow the receding fluid level to produce the array of separated rows shown in FIG. 11 which is a view along line 11—11 of FIG. 10. (Dashed line 110 indicates the line of contact between the fluid surface and the mesh and arrows 111 indicate the direction of removal of the container.)

Figure 12:
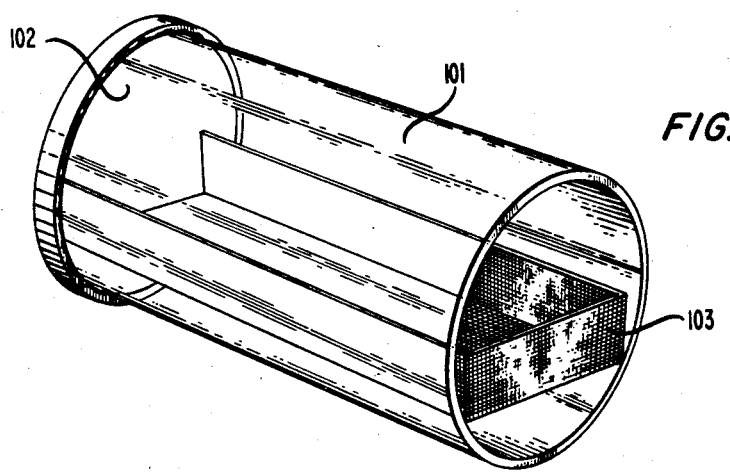
FIG. 12 is a perspective view of a portion of an apparatus useful for practicing the invention in accordance with a still further embodiment.

The process of floating chips to produce an array has a high success rate. Over 90% of the chips float. Occasionally some chips may not float due to grease or dirt on the chip, and other floating chips might cover the sunken chips. To avoid depositing chips that have floated on top of any that have sunk, an apparatus such as that shown in FIG. 12 may be employed where elements corresponding to those in FIG. 3 are similarly numbered. There a three-sided grid basket 103 was inserted into the container so that when the chips are added they are bounded on three sides by the grid and on a fourth side by the container while resting on the mesh. The container was submerged into the fluid bath in a vertical position and the fluid swirled as before. Instead of removing the container in a perpendicular direction, it was tilted toward the bottom of the grid 103 so that, upon removal, the fluid drained through the grid 103 and then through the mesh 102 while the chips that floated deposited on the bottom of the grid in an array like that shown in FIG. 9 or 11. (The close-packed array of FIG. 9 would result if the apparatus were lifted so that the bottom of grid 103 was parallel to the fluid surface, while the spread-out pattern would result if the container was tilted at some other angle.) The nonfloating chips were left on the mesh 102.

It should be appreciated that the inventive method is not limited to any particular number of chips or any particular size. Further, the invention may be applied to objects other than semiconductor chips which require robotic or other visual inspection.

Various additional modifications will become apparent to those skilled in the art. All such variations which basically rely on the teachings through which the invention has advanced the art are properly considered within the spirit and scope of the invention.

What is claimed is:

1. A method of producing a nonoverlapping ordered array of objects comprising the following steps:
   placing the objects onto a mesh screen within a container;
   partially submerging the container in a bath of suitable fluid to cause the objects in the container to float on the fluid surface;
   swirling the fluid around for a suitable period of time to cause the objects to order themselves in a nonoverlapping array in the center of the container; and
   removing the container from the bath without disturbing the nonoverlapping nature of the array.

2. The method according to claim 1 wherein the objects comprise semiconducting chips.

3. The method according to claim 1 wherein the container is open on one end and has the mesh material held in place by a tightly fitting rim on the end immersed in the fluid.

4. The method according to claim 1 wherein the bath of fluid comprises deionized water.

5. The method according to claim 1 wherein the container is removed by lifting it out in a direction essentially perpendicular to the fluid surface.

6. The method according to claim 1 wherein the container is removed by lifting it out at an angle to the fluid surface so as to spread apart the array of objects.

7. The method according to claim 1 wherein the size of the openings in the mesh screen combined with the surface tension of the fluid produces a convex surface within the container on which the objects float.

8. The method according to claim 7 wherein the size of the openings in the mesh is at least approximately 50 μm.

9. The method according to claim 7 wherein the surface tension of the fluid is within the range of 50-90 dynes/cm.

* * * * *